(12) United States Patent  
Nijkamp

(10) Patent No.: US 9,701,104 B2  
(45) Date of Patent: Jul. 11, 2017

(54) APPARATUS FOR PROCESSING A SUBSTRATE ON A SUPPORT BODY

(71) Applicant: Océ Holding B.V., Venlo (NL)

(72) Inventor: Aart Nijkamp, Venlo (NL)

(73) Assignee: OCÉ HOLDING B.V., Venlo (NL)

( * ) Notice: Subject to any disclaimer, the term of this patent is extended or adjusted under 35 U.S.C. 154(b) by 0 days.

(21) Appl. No.: 15/341,862

(22) Filed: Nov. 2, 2016

(65) Prior Publication Data

US 2017/0120574 A1    May 4, 2017

(30) Foreign Application Priority Data

Nov. 3, 2015 (EP) ..................................... 15192773  
Feb. 11, 2016 (EP) ..................................... 16155178

(51) Int. Cl.
*G03F 9/00* (2006.01)  
*B41J 13/26* (2006.01)  
(Continued)

(52) U.S. Cl.  
CPC ............... *B41F 21/00* (2013.01); *B41J 13/26* (2013.01); *B41J 13/32* (2013.01)

(58) Field of Classification Search  
CPC . G03F 9/00; B41C 1/1083; B41J 13/14; B41J 11/0045; B41J 11/0085;  
(Continued)

(56) References Cited

U.S. PATENT DOCUMENTS 6,712,003 B2 * 3/2004 Hashiguchi ........... B41C 1/1083  
101/477  
8,511,227 B2 * 8/2013 Hines .................... B41F 27/005  
101/415.1

(Continued)

FOREIGN PATENT DOCUMENTS

EP             1 297 954 A2    4/2003  
WO    WO 2016/059016 A1    4/2016

*Primary Examiner* — Huan Tran  
(74) *Attorney, Agent, or Firm* — Birch, Stewart, Kolasch & Birch, LLP

(57) ABSTRACT

An apparatus is provided for processing a substrate on a support body. The apparatus comprises the support body, at least one registration member, a carriage unit and a controller. The support body is arranged for supporting the substrate. The at least one registration member is adapted for registering the substrate on the support body by engaging the substrate in contact to the at least one registration member, when the at least one registration member is arranged into a registering state. The carriage unit is movably arranged relative to the support body for processing the substrate. The control unit is arranged for executing the steps of: a) selecting a position of the substrate on the support body; b) selecting a first registering position on the support body of a first registration member for registering the substrate at the selected position on the support body in the registering state, when engaging the substrate in contact with the first registration member being arranged in the first registering position; and c) moving the carriage unit relative to the support body to a processing position for processing the substrate, when the substrate is registered at the selected position on the support body by engaging the substrate in contact with the first registration member, which is arranged in the registering state in the first registering position.

16 Claims, 6 Drawing Sheets

(51) Int. Cl.
*B41J 13/32* (2006.01)
*B41F 21/00* (2006.01)

(58) Field of Classification Search
CPC . B65H 9/101; B65H 9/00; B65H 9/02; B65H 9/04; B65H 9/06; B41F 21/00
See application file for complete search history.

(56) References Cited

U.S. PATENT DOCUMENTS

| | | | |
|---|---|---|---|
| 2009/0103966 A1* | 4/2009 | Hoy | B65H 18/28 400/619 |
| 2011/0192304 A1 | 8/2011 | Hines | |
| 2017/0120629 A1* | 5/2017 | Nijkamp | B41J 11/0085 |

\* cited by examiner

APPARATUS FOR PROCESSING A SUBSTRATE ON A SUPPORT BODY

FIELD OF THE INVENTION

The present invention relates to an apparatus for processing a substrate on a support body. The present invention further relates to a printing apparatus for printing an image on a substrate, the printing apparatus being an apparatus according to the present invention.

BACKGROUND ART

A known printing apparatus comprises a support body for supporting a substrate and a print unit for printing an image on the substrate, when placed on the support body. The print unit may comprise a carriage unit and a print head assembly, the carriage being movably arranged for moving the print head assembly relative to the support body. The print head assembly faces the support body in printing operation and is arranged for applying a marking material on the substrate based on the image to be printed. The printing apparatus further comprises a control unit arranged for controlling the carriage unit to move over the support body for positioning the image on the substrate, when the substrate has been placed on the support body.

The support body comprises an assembly of registration pins, which are embedded inside the support body at a fixed position on the support body, i.e. a corner of the support body, to register a substrate in a predetermined position. The assembly of registration pins is arranged for registering the substrate in the predetermined position of the support body, when being brought into a registering state. The registering state of the assembly of registering pins is a protruding state from the support body, so to provide a contact to the substrate for registering.

The assembly of registration pins comprises a first set of registration pins and a second set of registration pins, the first set of registration pins being arranged along a first linear line which is substantially perpendicular to the second set of registration pins arranged along a second linear line. The assembly of registration pins is positioned for registering a substrate having two edges arranged perpendicular to each other, such as a rectangular substrate.

In this apparatus the position to register the substrate is fixed by the arrangement of the assembly of registration pins. Furthermore, in case more than one substrate fits onto the support body a desire is to register and process multiple substrates on the support body at the same time, wherein each substrate has a position different from one another. Even more, in order to optimize use of the support body a preferred position of the respective substrates depends on the size and shape of the set of multiple substrates. Furthermore, the known fixed assembly of the registration pins does not allow accurate registration and processing of substrates on another position of the support body and/or registration of substrates having deviant shapes.

SUMMARY OF THE INVENTION

It is accordingly an object of the present invention to provide an apparatus to flexibly register and process a substrate on the support body using at least one registration member in a registering state, wherein the substrate may have various sizes and shapes.

This object is attained by an apparatus for processing a substrate on a support body, the apparatus comprising the support body, at least one registration member, a carriage unit and a controller; the support body being arranged for supporting the substrate; the at least one registration member being adapted for registering the substrate on the support body by engaging the substrate in contact to the at least one registration member, when the at least one registration member is arranged into a registering state; the carriage unit being movably arranged relative to the support body for processing the substrate; wherein the control unit is arranged for executing the steps of: a) selecting a position of the substrate on the support body; b) selecting a first registering position on the support body of a first registration member for registering the substrate at the selected position on the support body in the registering state, when engaging the substrate in contact with the first registration member being arranged in the first registering position; and c) moving the carriage unit relative to the support body to a processing position for processing the substrate, when the substrate is registered at the selected position on the support body by engaging the substrate in contact with the first registration member, which is arranged in the registering state in the first registering position.

The control unit selects the position of the substrate on the support body. The position of the substrate may be selected by the control unit based on a shape and/or a size of the substrate. The control unit further selects a first registering position on the support body of a first registration member based on the selected position of the substrate. The first registering position of the first registration member may be selected by the control unit based on a shape and/or a size of the substrate. The first registration member, when arranged in the registering state at the first registration position, enables the accurate registering of the substrate, when engaging the substrate in contact with the first registration member being arranged in the first registering position. In this way an accurate and easy registering of the substrate is possible by engaging the substrate in contact with the first registration member, wherein the substrate is registered on a position on the support body selected by the control unit.

The substrate may be placed manually on the support body and manually registered relative to the first registration member. Alternatively, the substrate may be placed on the support body by a positioning device for placing the substrate on the support body and registering the substrate relative to the first registration member. When the substrate is registered on the support body by way of the first registration member, or additionally by another registration member, the control unit knows exactly the position of the substrate on the support body. The control unit moves the carriage unit relative to the support body to a processing position for processing the substrate, which is arranged in the selected position. The processing position of the carriage unit may be above the selected position of the substrate. For example, in a printing apparatus, the processing comprises printing an image. The carriage unit may carry a print head assembly, and the print head assembly is positioned by the carriage unit above the substrate for printing an image on the substrate, which is registered in the selected position. In this way, an accurate registering of the image onto the substrate is obtained. Alternatively or additionally, the processing may comprise cutting the substrate, may comprise exposing the substrate to a radiation signal and may comprise any other process for locally adapting the substrate.

Optionally, the first registration member may be removed from the support body after registering the substrate at the selected position by engaging the substrate in contact with the first registration member, which is arranged in the registering state in the first registering position, and before the substrate is processed. For example, the registered substrate may be held stationary during the processing by a suction force provided to the contact side of the substrate, after the substrate is registered at the selected position.

In an embodiment, the control unit is further arranged for: d) selecting a second registering position on the support body of a second registration member, the second registering position being selected for registering the substrate on the selected position on the support body in the registering state in cooperation with the first registration member, when engaging the substrate in contact with the first registration member and second registration member at the same time.

The control unit selects the second registering position to register the substrate on the selected position on the support body. The first and second registering position may be selected to register one edge of the substrate when engaging said edge of the substrate in contact with the first registration member and second registration member at the same time. In this example, the first and second registering positions are arranged along a first line, which defines an aligning line for said edge of the substrate in the selected position. The position of the first and second registering position along the aligning line may be selected by the control unit based on other considerations, as long as said edge of the substrate can be registered by the first registration member and second registration member.

Alternatively, the first and second registering position may be selected to register a first edge and a second edge, respectively, of the substrate when engaging the substrate in contact with the first registration member and second registration member at the same time. In this example, the first registering position is selected for defining a first aligning line for the first edge of the substrate and the second registering position is selected for defining a second aligning line for the second edge of the substrate. The position of the first and second registering position along the first and second aligning line, respectively, may be selected by the control unit based on other considerations, as long as the edges of the substrate can be registered by the first registration member and second registration member. In this example, the first registration member and second registration member determine the position of the substrate in two registering directions, each being perpendicular to the respective aligning line.

In an embodiment, the first registering position and the second registering position of the first and second registration member, respectively, are selected based on a shape of the substrate.

The first registering position and the second registering position may be selected based on a shape of one edge of the substrate for registering said edge of the substrate. For example, if the substrate has a circular shape, the first registering position and the second registering position are selected to register the substrate based on a predetermined diameter of the circular shape of the substrate.

The first registering position and the second registering position may also be selected based on an angle of a first edge relative to a second edge of the substrate. For example, if the substrate has the shape of a kite, having a first edge and a second edge being arranged at an angle of 60 degrees of one another, the first registering position and the second registering position are selected to define a first aligning line and to define a second aligning line, respectively, wherein the first aligning line and second aligning line are arranged at the angle of 60 degrees of one another. Additionally, a set of registering positions may be selected by the control unit along the first aligning line and/or second aligning line for arranging a set of registration members along the first aligning line and/or second aligning line, respectively.

In an embodiment, the control unit is further arranged for: e) selected a skew orientation of the substrate on the support body in the selected position; and wherein the first registering position and the second registering position of the first registration member and second registration member, respectively, are selected based on the selected skew orientation. The skew orientation of the substrate may be selected by the control unit. For example, the control unit may select the skew orientation based on a processing direction of the carriage unit relative to the support body. In a printing apparatus, the carriage unit may have a predetermined main scanning direction for printing an image onto the substrate. The control unit may select the skew orientation of the substrate on the support body to align an edge of the substrate to the processing direction of the carriage unit. Alternatively, the skew orientation of the substrate may be selected by receiving an instruction from an operator.

The selection of the first registering position and the second registering position of the first and second registration member enable accurately determining the skew orientation of the substrate on the support body by defining a first aligning line or by defining a first aligning line and a second aligning line using the first and second registration member.

In an embodiment, the apparatus further comprises a registration actuator mechanism for positioning each registration member on the support body in the registering state, and wherein the control unit is further arranged for: f) controlling the registration actuator mechanism to arrange the first registration member in the registering state at the selected first registering position on the support body. The registration actuator mechanism enables an accurate positioning of the first registration member at the selected first registering position on the support body. The registration actuator mechanism is controlled by the control unit. In this way, the first registration member is arranged in the registering state at the selected first registering position without an intervention by an operator. This supports an automatic and accurate positioning of the first registration member and any other registration member in the registering state for registering the substrate. The registration member is arranged by the registration actuator mechanism in the registering state independently of any other registration member.

In an embodiment, the registration actuator mechanism is movably arranging relative to the support body, and wherein step f) comprises further the step of moving the registration actuator mechanism relative to the support body towards the first registering position for arranging the first registration member at the selected first registering position in the registering state.

For example, the first registration member may be transported during step f) by the registration actuator mechanism towards the first registering position. Alternatively, the first registration member may already be present at the first registering position before step f), while not yet being arranged in the registering state, i.e. the first registration member is not yet protruding from the support body at the first registering position. The registration actuator mechanism may be movably arranged above the support body, such as a registration actuator mechanism being mounted on a carriage movably arranged with respect to the support body while facing a support surface of the support body. The control unit controls the movement of the registration actuator mechanism. The registration actuator mechanism, which is movably arranging relative to the support body, provides a simple device for actuating a first registration member into the registering state at a selected first registering position independently of any other registration member.

In another example, in case of a desire to register multiple substrates on the support body at the same time, multiple registration members may be arranged by the movable registration actuator into the registering state at several positions on the support body based on preselected positions of the substrates, each registration member being positioned for registering one of the substrates.

In an embodiment, the registration actuator mechanism comprises a plurality of registration units distributed inside the support body, each registration unit comprising a registration member and an actuator for arranging the registration member into the registering state, the actuator being controllable by the control unit; wherein in step b) the control unit selects the first registering position based on the locations of the plurality of registration units in the support body; and in step f) the control unit controls the actuator of the registration unit at the selected first registering position to arrange its registration member, being the first registration member, into the registering state at the selected first registering position.

The registration actuator mechanism provides a plurality of registration units distributed over positions of the support body and being ready to arrange the respective registration member into the registering state at the respective position of the support body. The control unit is operatively connected to each of the plurality of registration units for controlling the actuator to arrange the respective registration member into the registering state. The control unit selects the first registering position from one of the locations of the plurality of registration units. For example, the first registering position, and optionally including a second registering position, is selected to define an aligning line, which coincides with an edge of the substrate in the selected position on the support body.

Additionally, the control unit may select the second registering position from one of the locations of the plurality of registration units for registering the substrate based on a shape of the substrate. Accordingly, the control unit controls the selected registration unit to arrange its registration member, being the second registration member, into the registering state at the selected second registering position.

The registration actuator mechanism of this embodiment provides a fast and reliable positioning of the respective registration members at the selected registering positions.

In an embodiment, the control unit is further arranged for: g) indicating to an operator the first registering position on the support body for arranging the first registration member.

By indicating the first registering position on the support body to the operator, the operator may manually arrange the first registration member in the registering state at the desired registering position. The indication to the operator may be performed by visually locating the first registering position, may be performed by indicating the first registering position by referring to a specific label, said label being present on the support body at the first registering position, and may be any other indication to the operator.

The registration member may be connectable to the support body and the operator may manually connect the registration member to the support body at the indicated registering position. Alternatively, the registration member may be located inside the support body at the desired registering position and the operator may manually arrange, for example by way of screwing, the registration member into the registering state at the indicated registering position.

In an embodiment, step g) comprises projecting a light mark on the support body at the first registering position. The light mark visually indicates the first registering position to the operator, thereby enabling the operator to locate the first registering position. This is an easy way of locating the first registering position. The light mark may be projected by a single light source facing the support body. In an example, said light source may be mounted on a carriage for moving the light source relative to the support body. Alternatively, the light mark may be projected by a selected one of a plurality of light sources differing in light projection position on the support body, the control unit being operatively connected to each light source for selectively activating one light source of the plurality of light sources.

The light mark may be cross shaped, may be shaped as an arrow, and may have any other suitable shape for indicating the corresponding registering position.

In an embodiment, the control unit further comprises a user interface for receiving instructions from an operator, and the control unit is further arranged for: h) waiting for an instruction from the operator that the first registration member is arranged in the registering state at the first registering position on the support body; and i) in response to said instruction, indicating to an operator a second registering position on the support body for arranging a second registration member for registering the substrate at the selected position. This embodiment supports a subsequent and accurate positioning of the first registration member and second registration member, respectively, on the support body by the operator.

In an embodiment, the at least one registration member is connectable to the support body, each registration member comprising a positioning element for connecting the first registration member to the support body in the registering state; and an aligning edge for contacting the substrate and wherein in step b) the first registering position is selected further based on a predetermined distance between the positioning element and the aligning edge of the first registration member. The control unit knows the predetermined distance between the positioning element and the aligning edge of the first registration member. The control unit selects the first registering position, wherein the first registering position is arranged offset from an edge of the substrate based on the predetermined distance of the first registration member. For example, if the predetermined distance is 20 mm, the first registering position is selected 20 mm offset from an edge of the substrate in the selected position of the substrate on the support body. In this way, the first registering position may be selected away from the position of the substrate based on the predetermined distance between the positioning element and the aligning edge of the respective registration member.

In an embodiment, the control unit is arranged for: j) selecting the first registration member from a set of registration members having differing distances between the positioning element and the aligning edge based on a desired distance between the position of the substrate selected in step a) and the first registering position selected in step b). The set of registration members has differing distances between the positioning element and the aligning edge. In this way, the selection of the first registering position is more flexible. For example, the registration members of the set provide distances of 10 mm, 15 mm, 20 mm and 25 mm, respectively. The one registration member is selected as the first registration member, which has the desired distance between the position of the substrate selected in step a) and the first registering position selected in step b). If the first registering position is selected at another position, another of the registration members of the set may be selected based on the desired distance. The control unit may additionally indicate to the operator, which of the registration members of the set is selected as the first registration member to be arranged at the first registering position.

In an embodiment, the control unit is arranged for: k) selecting the first registration member from a set of registration members having an aligning edge of differing shapes based on a shape of the substrate. The set of registration members has aligning edges of differing shapes. The control unit selects the first registration member based on a shape of the substrate. For example, if the substrate is circular shaped, the control unit may select a registration member having an aligning edge, which has an arched shape being conformal to a part of the circular edge of the substrate. In another example, if the substrate is rectangular shaped, the control unit may select a registration member having two aligning edges being perpendicular arranged to on another and which together define a corner position of the substrate.

The control unit may additionally indicate to the operator, which of the registration members of the set is selected as the first registration member to be arranged at the first registering position.

In an embodiment, the support body comprises a plurality of receiving elements distributed on positions over the support body for retaining a registration member in the registering state at the respective positions, and wherein in step b) the first registering position is selected from one of the positions of said plurality of receiving elements. The control unit knows the positions of each of the plurality of receiving elements on the support body. The receiving elements provide a reliable fixation of the registration member in the registering state at the respective position. For example, the receiving element comprises a hole having a shape being conformal to a positioning element, such as a shaft of the registration member. In this way, the hole easily retains the positioning element of the registration member, when the positioning element of the registration member is placed inside the hole. This supports a registering state, e.g. a protruding state, of the registration member.

This embodiment of the receiving elements, which have known positions on the support body, can easily be combined with the selection of the first registration member from a set of registration members having differing distances between the positioning element and the aligning edge based on a desired distance between the position of the substrate selected in step a) and the first registering position selected in step b).

In an embodiment, the apparatus is a printing apparatus, wherein the printing apparatus further comprises a print head assembly arranged for providing an image on the substrate, when the substrate is registered in the selected position, wherein the print head assembly is mounted to the carriage unit.

In a further aspect, the present invention provides a method for processing a substrate on a support body using a printing apparatus, preferably according to the present invention. The apparatus comprises the support body, at least one registration member, a carriage unit, and a controller. The support body is arranged for supporting the substrate. The support body is provided with or comprises a plurality of spaced apart registering positions. The registering positions are preferably provided in a matrix. The at least one registration member is adapted for registering the substrate on the support body by engaging the substrate in contact to the at least one registration member, when the at least one registration member is arranged into a registering state. The registration member is preferably arranged for being in a holding engagement with the support body at at least one of the registering positions. The holding engagement may be releasable or moveable for allowing the registration member to be transported with respect to at least one of the registering positions. The carriage unit is movably arranged relative to the support body for processing the substrate. The method comprises the steps of:

a) the control unit selecting a substrate position for the substrate on the support body;
b) the control unit selecting a first registering position from the plurality of registering positions on the support body, preferably in correspondence to the selected substrate position, for example wherein the registration member is arranged for registering the substrate at the selected first reposition on the support body in the registering state;
c) moving the registration member with respect to the support body for positioning the registration member into a registering state at the selected first registering position, such that the registration member is arranged for engaging the substrate; and
d) the control unit moving the carriage unit relative to the support body to a processing position for processing the substrate, when the substrate is registered at the selected position on the support body by engaging the substrate in contact with the first registration member, which is arranged in the registering state in the first registering position.

Step c may be performed by an operator upon indication of the first registering position by the apparatus according to the present invention or by the control unit controlling an actuator mechanism to move or position the positioning the registration member at the selected first registering position. The registration member may be transported over or through the support body, preferably from a storage position or container, to the selected registering position. It will be appreciated that the above steps may be repeated to provide a second registration member at second registering position. The registering positions are preferably selected by the control unit to be positioned along or in accordance with one or more edges or contours of the substrate if the substrate were positioned at the selected substrate position.

In an embodiment, the method according to the present invention may further comprise the steps of:
determining a contour position of a contour of the substrate when positioned at the substrate position; and
selecting the first registering position, such that the registering position is position along or adjacent the contour of the substrate when positioned at the substrate position.

Thereby, the control unit determines the position of one or more edges of the substrate, which one or more edges may be engaged by a registration member. The control unit determines the first registering position, such that a registration member is positioned adjacent said edge for engaging the substrate. This ensures the substrate is properly positioned at the substrate position when printing.

Further scope of applicability of the present invention will become apparent from the detailed description given hereinafter. However, it should be understood that the detailed description and specific examples, while indicating embodiments of the invention, are given by way of illustration only, since various changes and modifications within the scope of the invention will become apparent to those skilled in the art from this detailed description.

BRIEF DESCRIPTION OF THE DRAWINGS

Hereinafter, the present invention is further elucidated with reference to the appended drawings showing non-limiting embodiments and wherein.

DETAILED DESCRIPTION OF EMBODIMENTS

Figure 1:
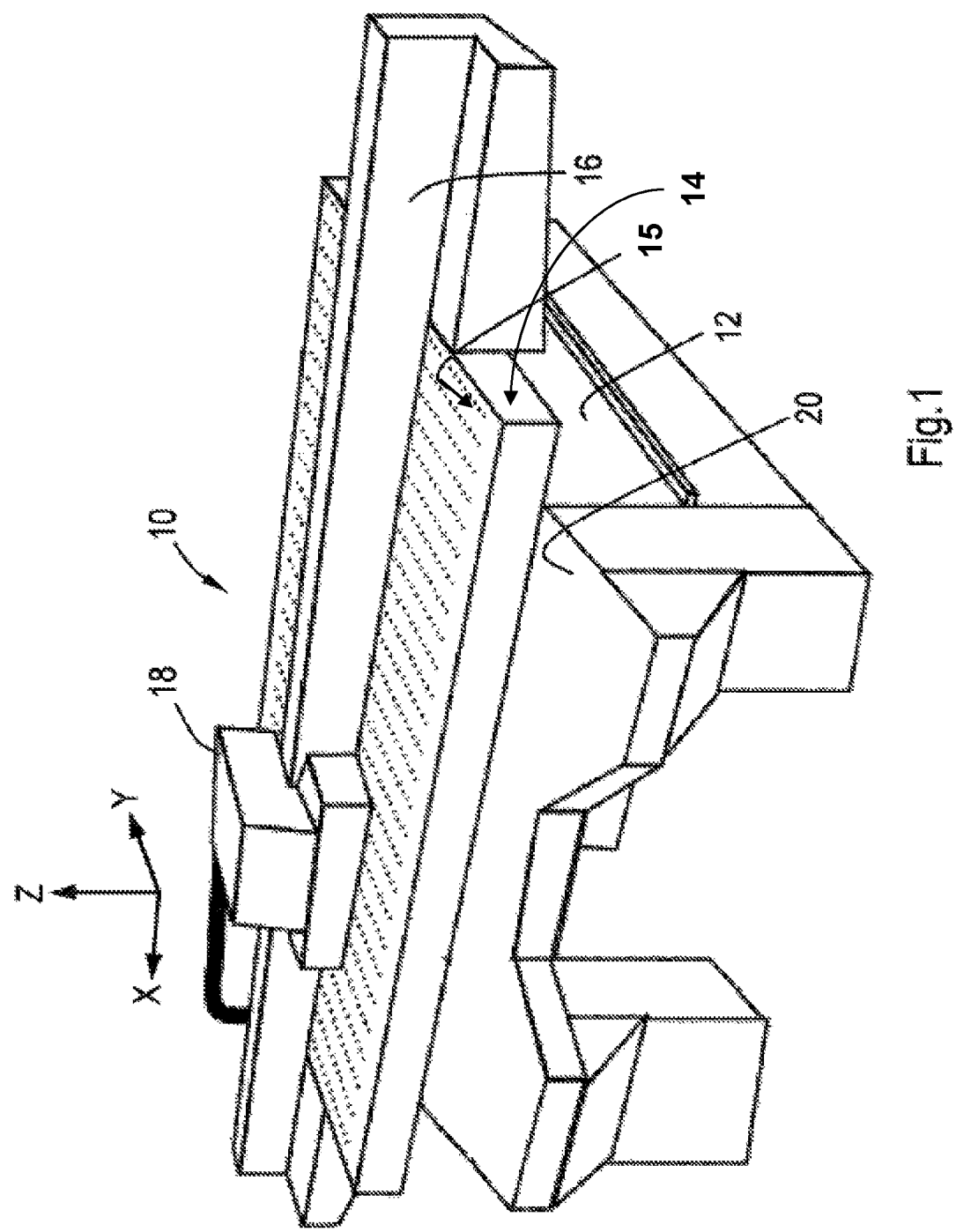
FIG. 1 shows a schematic view of a prior art print engine in which a method according to the invention may be used.

The present invention will now be described with reference to the accompanying drawings, wherein the same reference numerals have been used to identify the same or similar elements throughout the several views.

FIG. 1 shows a printing device 10 for printing an image or text on a relatively large substrate, in particular on a relatively large and flat substrate. Such a printing device 10 is well known in the art. The printing device 10 comprises a support assembly 12 on which a support body 14 is mounted comprising a printing surface 15 for supporting said substrate. As illustrated, the printing surface 15 may be provided with suction holes for pulling the substrate onto the printing surface 15 and thereby holding the substrate flat on the printing surface 15 of the support body 14. A guiding assembly 16 is provided for supporting and guiding a carriage 18. The carriage 18 is movably supported by the guiding assembly 16 such that the carriage 18 may be moved over the printing surface 15. For example, the guiding assembly 16 may be movably supported on the support assembly 12 such that the guiding assembly may be moved in a y-direction (as indicated in FIG. 1) and the carriage 18 may be moveably supported by the guiding assembly 16 such that the carriage may be moved in a x-direction guided by the guiding assembly 16. The carriage 18 is provided with a printing element such as an inkjet print head for printing the image or the text on the substrate arranged on the printing surface 15 by ejecting ink drops at preselected positions. It is noted that the guiding assembly 16 and/or the carriage 18 may be supported such that they may be moved in a z-direction, thereby enabling to print on different media (i.e. substrates) having a different dimension in the z-direction (when positioned on the printing surface 15).

Figure 2A:
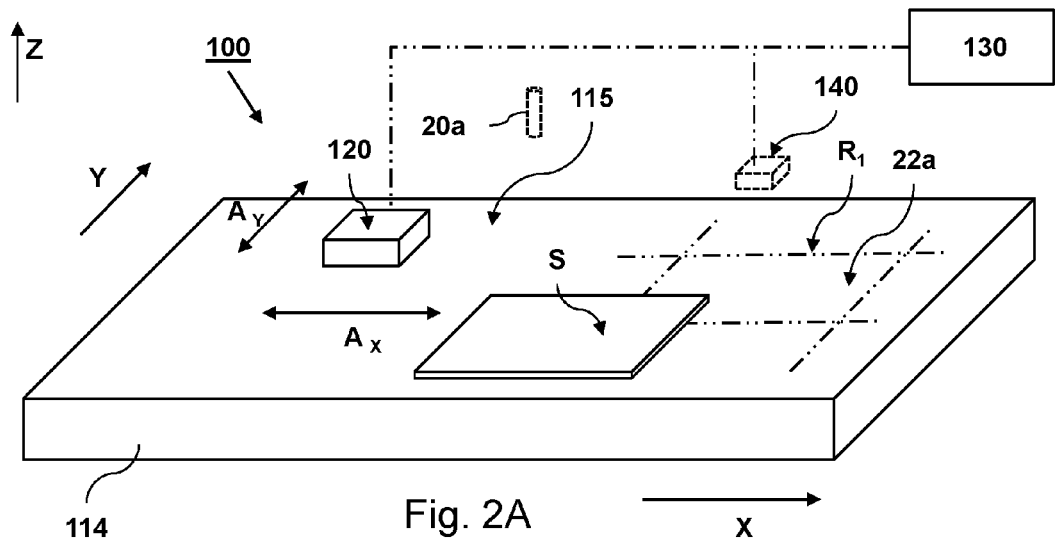
FIGS. 2A-2B show a schematic view of an embodiment of the apparatus according to the present invention and a method according to the present invention, respectively.
Figure 2B:
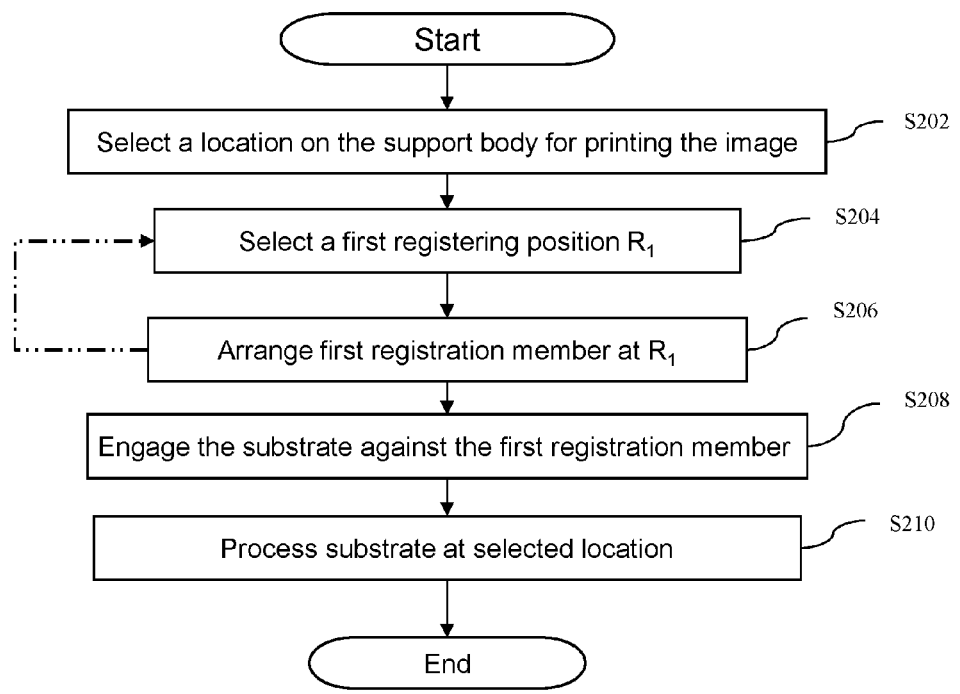

FIGS. 2A-2B show a schematic view of an embodiment of the apparatus according to the present invention and a method according to the present invention, respectively. FIG. 2A shows a schematic perspective view of an embodiment of an apparatus according to the present invention. The apparatus 100 comprises a support body 114 for supporting a substrate S on a support surface 115, at least one registration element 20a, a carriage unit 120 and a control unit 130. The support body 114 including the support surface 115 extends in a direction X and a direction Y normal to the direction X.

Said carriage unit 120 is arranged facing the support surface 115 and is movably arranged with respect to the support surface 115 of the support body 114 as indicated by arrows $A_x$ and $A_y$. The direction $A_x$ is parallel to the direction X and the direction $A_y$ is parallel to the direction Y of the support surface 115. The carriage unit 120 is arranged to process a substrate S, when the substrate is placed on the support surface 115. The control unit 130 controls the carriage unit 120 and determines the movements of the carriage unit 120 relative to the support body 115, i.e. along the directions as indicated by arrows $A_x$ and $A_y$. Optionally, the control unit 130 may control the movement of the carriage unit 120 in a direction parallel to the direction Z.

Optionally the apparatus further comprises a light projecting device 140, which is arranged for projecting a light mark on the support surface 115 of the support body 114.

Now referring to the flowchart shown in FIG. 2B, which shows an embodiment of the method according to the present invention. In a first step S202 of the method a position 22a for the substrate S is selected by the control unit 130 on the support surface 115 of the support body 114. The position of the substrate 22a may be selected based on a shape and/or size of the substrate S.

In a next step S204, the control unit 130 selects a first registering position $R_1$ on the support body 114 of a first registration member 20a for registering the substrate S at the selected position 22a in the registering state of the first registration member 20a. The first registering position $R_1$ is selected from a plurality of possible registering positions 24, which are distributed over the support surface 115 of the support body 114, see FIGS. 3A and 3B. The registering positions 24 are arranged in a matrix extending both in direction a and b. For example, the registering positions 24 may be arranged in rows extending in the direction b, as shown in FIGS. 3A and 3B, the rows being arranged adjacent one another in the direction a.

The registering state of the first registration member 20a is a state wherein the first registration member 20a protrudes from the support surface 115 of the support body 114, i.e. in the direction Z. The substrate S may have various shapes. The first registering position $R_1$ is selected based on the shape of the substrate S.

Figure 3A:
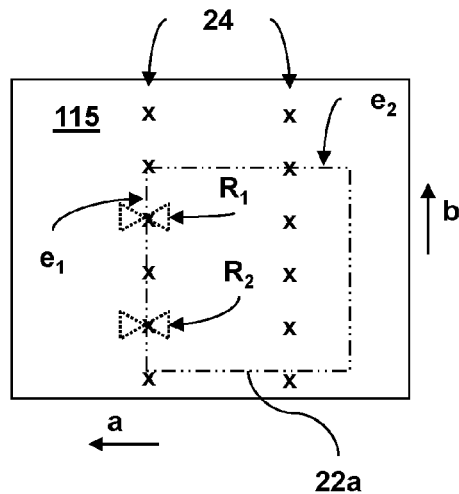
FIGS. 3A-3B schematically show embodiments of the method according to the FIG. 2B to be used in the apparatus according to the present invention.
Figure 3B:
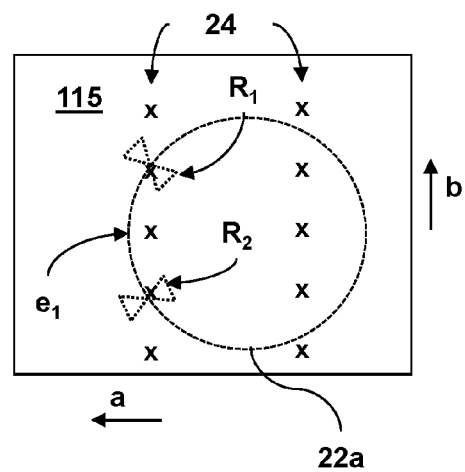

Examples of selecting the first registering position $R_1$ is shown in FIGS. 3A-3B, respectively. FIGS. 3A and 3B show a plane view of the support surface 115 of the support body 114. In FIG. 3A a position 22a for a rectangular substrate is selected on the support body 114. In step S204, a first registering position $R_1$ is selected from possible registering positions 24, which are distributed over the support surface 115 of the support body 114, such that the first registering position $R_1$ coincides with an aligning line $e_1$ for engaging an edge of the substrate S at the selected position 22a of the substrate S.

FIG. 3B shows a position 22b for a circular substrate, which is selected on the support body 114. In step S204, a first registering position $R_1$ is selected from possible registering positions 24, which are distributed over the support surface 115 of the support body 114, such that the first registering position $R_1$ coincides with an aligning line $e_1$ for engaging the circular edge of the substrate S at the selected position 22b of the circular substrate S.

Figure 4A:
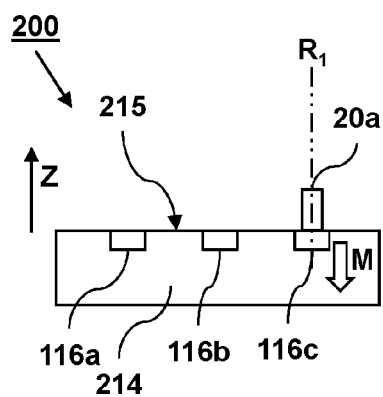
FIGS. 4A-4B schematically show examples of a registration member in a registering state in the apparatus according to the present invention.
Figure 4B:
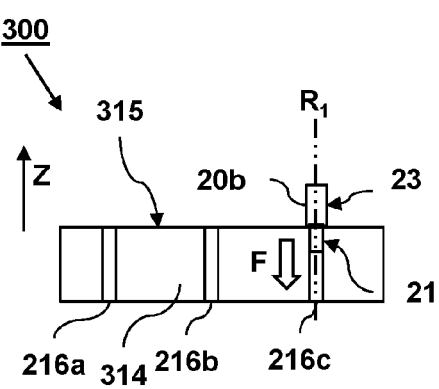

In a next step S206, a first registration member 20a is arranged in the first registering position $R_1$ in the registering states. In the registering state the registration member 20a protrudes from the support surface 115 of the support body 114. FIGS. 4A and 4B show examples of various registration members and their protruding state for use in the method according to FIG. 2B.

FIG. 4A shows a cross section of a support body 214 of an exemplary apparatus 200 along the height direction Z. The support body 214 comprises a plurality of receiving elements 116a-116c arranged close to the support surface 215 and distributed over the plane of the support surface 215. Each of the receiving elements 116a-116c comprises a magnetic element arranged for retaining a registration member 20a, which is comprises a metal component to be attracted by the magnetic element. A first registration member 20a is arranged at a selected first registering position $R_1$ standing on the receiving element 116c, i.e. protruding from the support surface 215 in the registering state. The magnetic force M provided by the to the receiving element 116c to the first registration member 20a is strong enough to retain the first registration member 20a in the first registering position $R_1$, when a substrate S is engaged on contact to the first registration member 20a to register the substrate S on the support body 214.

In a modified embodiment of FIG. 4A, which is not shown, the receiving elements 116a-116c are replaced by a receiving layer extending along the support surface 215 and comprising magnetic elements for retaining the first registration member 20a at any position along the support surface 215 by providing a magnetic force M to the first registration member 20a.

FIG. 4B shows a cross section of an alternative support body 314 of an apparatus 300 along the height direction Z. The support body 314 comprises a plurality of suction holes 216a-216c arranged for providing a suction force to the support surface 315 and distributed over the plane of the support surface 315. Each of the suction holes 216a-216c is operatively connected to a suction source for providing the suction force to a contact side of the substrate S, when the substrate S is placed on the support surface 315 of the support body 314. Each of the suction holes 216a-216c can be used as a receiving element.

A first registration member 20b is arranged in the registering state at a selected first registering position $R_1$, which coincides with the suction hole 216c. The first registration member 20b comprises a positioning pin 21, which is shaped to fit into the suction hole 116c, and a protruding pin 23, connected to the positioning pin 21a and having a diameter, which does not fit into the suction hole 116c. In the registering state the positioning pin 21 is fit into the suction hole 116c and the protruding pin 23 protrudes from the support surface 315 of the support body 314. The first registration member 20b is retained to the support body 214 by applying a suction force F through the suction hole 116c onto the positioning pin 21 of the first registration member 20b.

In step S206 the first registration member 20a may be arranged in the registering state at the first registering position $R_1$ in various ways, as illustrated in the embodiments, shown in FIGS. 5A-5C, FIGS. 6A-6B, FIGS. 7A-7C, FIG. 8.

For example, the registration members 20a may be available in the support body 114 in any of selected registering positions $R_1$ to be arranged by the control unit 130 in the registering state. Examples are further explained in relation to the embodiments of FIGS. 7A-7C and FIG. 8.

Alternatively, the registration element 20a may be transported by a registration actuator to any of selected registering positions $R_1$ to be arranged in the registering state by the control unit 130. An example is further explained in relation to the embodiment of FIG. 5A-5C.

Figure 5A:
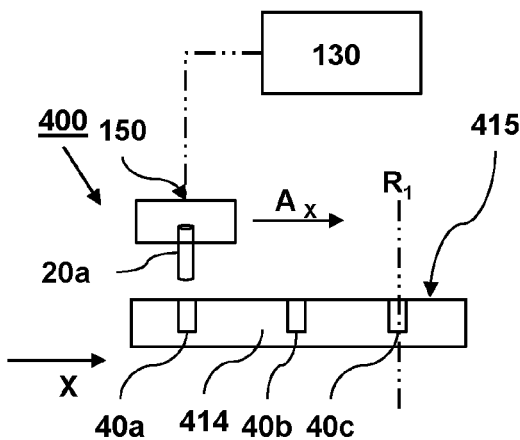
FIGS. 5A-5C schematically show an embodiment of the apparatus according to the present invention and of the method according to the FIG. 2B.
Figure 5B:
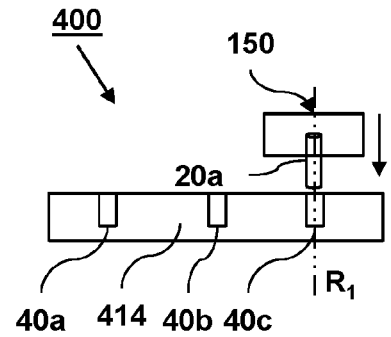
Figure 5C:
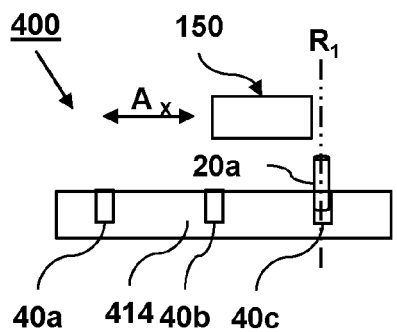

Now referring to FIGS. 5A-5C, which show a detailed cross section of a support body 414 of an apparatus 400. The apparatus comprises the support body 414, at least one registration member 20a, a registration actuator 150, and a control unit 130. The registration actuator 150 is movably arranged relative to the support surface 415 of the support body 414. The registration member 20a may in examples be a registration pin, a registration ruler having an alignment edge extending in a first direction or may be a registration member having a first alignment edge extending in a first direction and a second alignment edge extending in a second direction.

FIGS. 5A-5C show a detailed cross section of the support body 414 in the X direction of the support surface 415. FIG. 5A shows a first stage of step S206 of the method according to FIG. 2B be used in the apparatus 400. In the first stage the registration member 20a, for example a registration pin which is mounted on the registration actuator 150, is moved by the registration actuator 150 over the support surface 415 in a direction as indicated by arrow $A_x$ towards a first registering position $R_1$ on the support surface 415, also shown in FIG. 2A. The support body 414 comprises a retaining mechanism, such as a plurality of receiving holes 40a-40c distributed over the support surface 415. A third receiving holes 40c is arranged at the first registering position $R_1$. Each of the receiving holes 40a-40c is shaped for accommodating a part of the registration member 20a and retaining the registration member 20a in the registering state.

FIG. 5B shows a second stage of step S206 of the method according to the present invention to be used in the apparatus 400. In the second stage the registration member 20a is arranged by the registration actuator 150 above the third receiving hole 40c in the first registering position $R_1$. The registration actuator 150 moves the registration member 20a in a engaging direction as indicated by arrow E to partly arrange the registration member 20a into the receiving hole 40c.

FIG. 5C shows a third stage of step S206 of the method according to the present invention to be used in the apparatus 400. In the third stage the registration member 20a is arranged in the registering state in the first registering position $R_1$. The registration actuator 150 is moved over the support surface 415 away from the registration member 20a in the direction as indicated by arrow $A_x$. Alternatively, the registration actuator 150 may be moved over the support surface 415 in any other direction to clear the support surface 415.

The steps S204 and S206 may be may be repeated to arrange another registration member 20b on another registering position $R_x$ on the support surface 415 to register the substrate S in the substrate position 22a, selected in step S202 (shown in FIG. 2). For example, a second registering position $R_2$ is selected in step S204 for a second registration member 20b, as is shown in FIGS. 3A and 3B. The first registering position $R_1$ and second registering position $R_2$ are selected based on the shape of the substrate S, as can be seen from FIGS. 3A and 3B. The second registering position $R_2$ is selected to provide an aligning line $e_1$ in cooperation with the first registering position $R_1$, as shown in FIGS. 3A and 3B. The first registering position $R_1$ and the second registering position $R_2$ are selected cooperatively to define the aligning line $e_1$, such that an edge of the substrate S is registered at the substrate S position 22a, when engaging the substrate S in contact to the first registration member 20a and second registration member 20b at the same time.

Alternatively, the first registering position $R_1$ and second registering position $R_2$ may be selected to register a first edge and a second edge, respectively, of the substrate when engaging the substrate in contact with the first registration member 20a and second registration member 20b at the same time. In this example, the first registering position R1 is selected for defining a first aligning line $e_1$ for the first edge of the substrate and the second registering position R2 is selected for defining a second aligning line $e_2$ for the second edge of the substrate, as shown in FIG. 3A. The position of the first registering position $R_1$ and second registering position $R_2$ along the first second aligning line $e_1$ and second aligning line $e_2$, respectively, are selected by the control unit 130 based on other considerations, as long as the edges of the substrate S can be registered by the first registration member 20a and second registration member 20b. In this example, the first registration member 20a and second registration member 20b determine the position of the substrate S in two registering directions, i.e. directions a and b, each being perpendicular to the respective aligning line $e_1$, $e_2$.

Referring to FIGS. 5A-5C, the sequence of first stage, second stage and third stage of the method may be repeated to arrange the second registration member 20b on the second registering position $R_2$ on the support surface 415 to register the substrate S in the substrate position 22a, selected in step S202 (shown in FIG. 2).

In step S208 as shown in FIG. 2B, after sufficient registration members 20a have been arranged in selected registering positions $R_1$, $R_2$ on the support surface 115, 415 to register the substrate S, edges of the substrate S may be engaged against the at least one registration member 20a arranged in the registering state to register the substrate S on the support surface 115, 415 in the selected position 22a (shown in FIG. 2).

In this way the substrate S is registered accurately at the position 22a on the support body 114, 414 which was selected in step S202.

In step S210 the control unit moves the carriage unit 120 over the support body 115, 415 to a processing position for processing the substrate S, which is registered in the substrate position 22a. In step S210, the processing step may comprise printing an image on the substrate by a print head assembly mounted on the carriage unit 120. Alternatively or additionally, in step S210 processing the substrate S may comprise cutting the substrate S.

Optionally, the registration members 20a are removed from the registering state on the support body after step S208 and before step S210. For example, the registered substrate S may be held stationary on the support body 315 during the processing by a suction force provided to the contact side of the substrate S, after the substrate is registered at the selected position 22a.

After the substrate S has been processed according to appropriate processes, such as printing an image on an outer surface of the substrate S, fixing the image to the substrate S and/or cutting the substrate S, the substrate is ready to be removed from the support surface 115, 415.

Figure 6A:
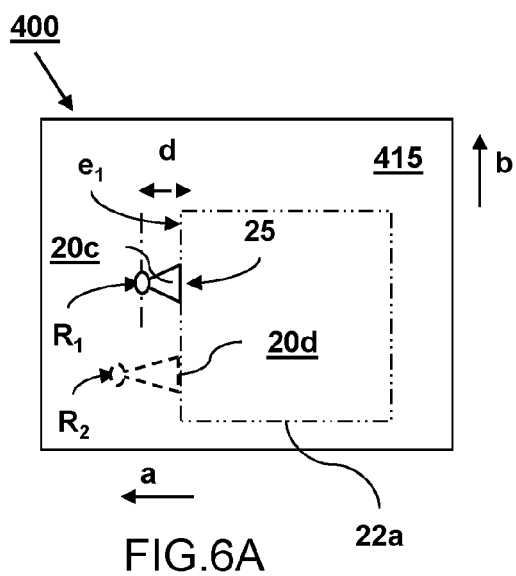
FIGS. 6A-6B schematically show a modified embodiment of the method according to the FIG. 2B to be used in the apparatus according to the FIGS. 5A-5C.
Figure 6B:
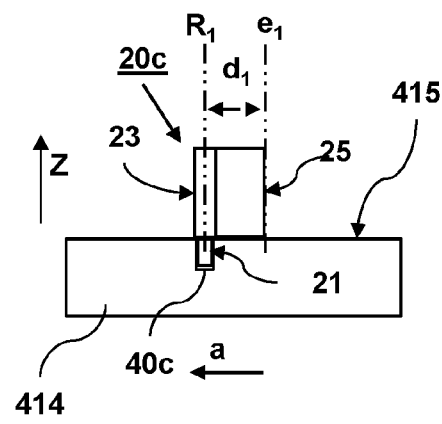

FIGS. 6A-6B schematically show a modified embodiment of the method according to the FIG. 2B to be used in the apparatus according to the FIGS. 5A-5C.

FIG. 6A shows a plane view of the support surface 415 of the support body 414 of the apparatus 400 shown in FIGS. 5A-5C. FIG. 6B shows a cross section of the support body 415 and a first registration member 20c along a height direction Z.

Instead of the first registration member 20a of the embodiment shown in FIG. 5A being a registration pin, which protrudes from the receiving hole 40c at the registering position R1, the first registration member 20c is selected by the control unit 130 from a set of registration members. Each registration member comprises a positioning pin 21, which is arranged inside the receiving hole 40c for connecting the registration member to the receiving hole 40c of the support body 314, and an aligning edge 25 for contacting the substrate S. The aligning edge 25 is connected to the positioning pin 21 by a protruding element 23. The positioning pin 21 and the aligning edge 25 are arranged at a predetermined distance $d_1$ between one another. The control unit 130 selects the first registering position $R_1$ in step S204 and the first registration member 20c such that the aligning edge 25 is arranged offset to the first registering position $R_1$ at a distance $d_1$ to register the substrate S at the position selected in step S202. For example, the distance between the first registering position $R_1$ and the aligning line e1 of the substrate position 22a is 20 mm. The control unit selects the first registration member 20c for arranging at the first registering position $R_1$, which has a predetermined distance of 20 mm between the positioning pin 21 and the aligning edge 25. In this way, the first registering position $R_1$ is suitably selected away from the position of an edge of the substrate S in the position 22a.

The registration actuator 150 picks the first registration member 20c from the set of registration members, transports the first registration member 20c to the receiving hole 40c and arranges the first registration member 20c in the registering state at the receiving hole 40c.

Likewise, in a sub sequent step S204-S206 the control unit 130 selects a second registering position $R_2$, which is arranged offset from the aligning line $e_1$ at a distance larger than the distance $d_1$ between the first registering position $R_1$ and the aligning line $e_1$. In step S206 the control unit 130 selects a second registration member 20d, having a predetermined distance $d_2$ between the positioning pin and the aligning edge, which is equal to the offset between the second registering position $R_2$ and the aligning line $e_1$. The second registration member 20d is arranged in the registering state at the second registering position $R_2$ by the registration actuator 150.

In this way, differing offsets of the selected registering position $R_1$, $R_2$ to the aligning line e1 are bridged by suitably selecting a registration member to be used for registering the substrate S at the selected position 22a.

Figure 7A:
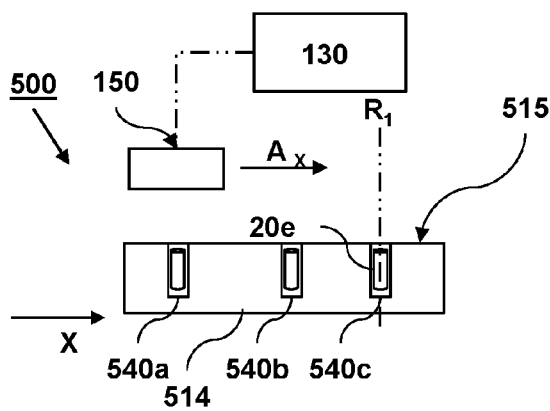
FIGS. 7A-7C schematically show a modified embodiment of the apparatus according to FIGS. 5A-5C and of the method according to the FIG. 2B.
Figure 7B:
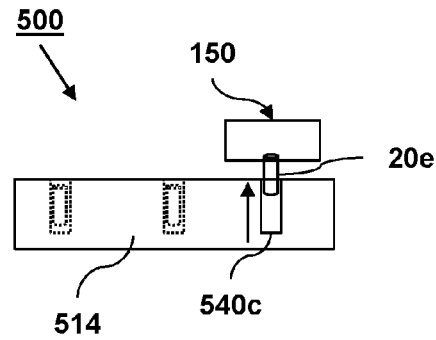
Figure 7C:
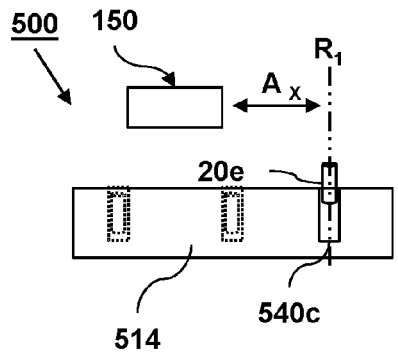

FIGS. 7A-7C schematically show a modified embodiment of the apparatus according to FIGS. 5A-5C and of the method according to the FIG. 2B. The apparatus 500 comprises a support body 514 for supporting a substrate S on a support surface 515, a plurality of registration members 20e and a registration actuator 150.

FIGS. 7A-7C show a detailed cross section of the support body 514 in the X direction of the support surface 515. The support body 514 comprises a retaining mechanism, such as retaining holes 540a-540c. A third retaining hole 540c is arranged at the first registering position $R_1$, which is selected in step S204. Each of the retaining holes 540a-540c is shaped for fully accommodating a registration member 20e and storing the registration member 20e inside the respective retaining hole 540a-540c close to the support surface 515.

FIG. 7A shows a first stage of the method according to the present invention to be used in the apparatus 500. In the first stage the registration actuator 150 is moved over the support surface 515 in a direction as indicated by arrow $A_x$ towards a first registering position $R_1$ of the support surface 515. In the first registering position $R_1$ a retaining hole 540c is arranged inside the support body 214 and encloses a registration member 20e, such as a registration pin. The registration pin 20e of each retaining holes 540a-540c is disposed inside the respective retaining holes 540a-540c in a standby state. The registration pin 20e in the standby is arranged below the support surface 515 for not registering a substrate on the support body 514.

FIG. 7B shows a second stage of the method according to the present invention to be used in the apparatus 500. In the second stage the registration actuator 150 is arranged above the third retaining hole 540c in the first registering position $R_1$. The registration actuator 150 moves the registration member 20e from the third retaining hole 540c in an engaging direction as indicated by arrow E to arrange a first part of the registration member 20e protruding from the support surface 514 in a registering state. In the registering state a second part of the registration member 20e is arranged inside the third retaining hole 540c for keeping the registration member 20e stationary with respect to the support surface 515.

FIG. 7C shows a third stage of the method according to the present invention to be used in the apparatus 500. In the third stage the registration member 20e is maintained in the registering state in the first registering position $R_1$ by the third retaining hole 540c. The registration actuator 150 is moved over the support surface 515 away from the registration member 20e in the direction as indicated by arrow $A_x$. Alternatively, the registration actuator 150 may be moved over the support surface 515 in any other direction to clear the support surface 515.

The sequence of first stage, second stage and third stage of the method may be repeated to arrange another registration member 20e on another selected registration position of the support surface 515 to register the substrate S in the preselected position 22a (shown in FIG. 2).

After sufficient registration members 20e have been arranged in selected positions on the support surface 515 to register the substrate S, in step S208 (not shown) edges of a substrate S may be urged against the at least one registration member 20e arranged in the registering state to register the substrate S on the support surface 515 in the preselected position 22a (shown in FIG. 2).

In step S210 the control unit 130 controls the carriage unit 120 to process the substrate S at the position 22a. After the substrate S has been processed in step S210 according to appropriate processes, such as printing an image on an outer surface of the substrate S, fixing the image to the substrate S and/or cutting the substrate S, the substrate may be removed from the support surface 515.

Figure 8:
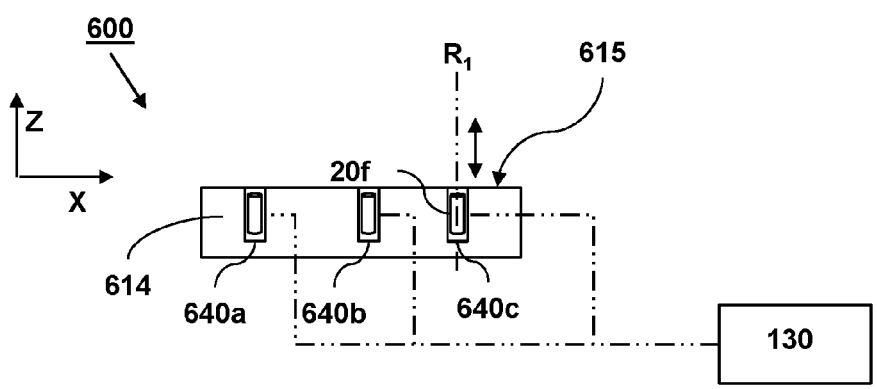
FIG. 8 schematically shows a detailed view of another embodiment of an apparatus according to the present invention.

FIG. 8 schematically shows a detailed view of another embodiment of an apparatus according to the present invention and of the method according to FIG. 2B. The apparatus 600 comprises a support body 614 for supporting a substrate S on a support surface 615, a plurality of registration units 640a-640c and a control unit 130. FIG. 8 shows a detailed cross section of the support body 614 in the X direction of the support surface 615. The plurality of registration units 640a-640c are arranged inside the support body 614 and are distributed over the support surface 615 in both directions X and Y of the support surface 615, as shown in FIG. 2A.

Each registration unit 640a-640c comprises a registration member 20f and an actuator (not shown) for arranging the registration member 20f into a registering state, i.e. protruding from the support surface 615 in the height direction Z. When arranged in a standby state, the registration member 20f is arranged inside the registration unit 640a-640c. The actuator may move the registration member 20f in a direction U to arrange the registration member 20f in the registering state at the position of the registration unit 640a-640c on the support surface 615. Likewise, the actuator may move the registration member 20f in a direction U from the registering state back to the standby state in the registration unit 640a-640c below the support surface 615.

The control unit 130 is operatively connected to all of the actuators of the registration units 640a-640c to control the actuator.

In step S204 of the method shown in FIG. 2B, the control unit 130 selects the first registering position R1 based on the locations of the registration units 640a-640c in the support body 614, i.e. the positions relative to support surface 615. For example, in step S202 the position of a third registration unit 640c is selected as first registering position $R_1$ to register the substrate S at the selected position 22A, selected in step S202. In step S206, the control unit 130 controls the actuator of the third registration unit 640c to move its registration member 20f, being the first registration member, into the registering state at the first registering position $R_1$.

Likewise, steps S204-S206 can be repeated to select a second registering position $R_2$ based on the locations of the registration units 640a-640c in the support body 614, and to arrange a second registration member in the registering state at the second registering position $R_2$, by controlling the respective actuator of the corresponding registration unit, to register the substrate S in the preselected position 22a (shown in FIG. 2).

After sufficient registration members 20f have been arranged in selected positions on the support surface 615 to register the substrate S, in step S208 (not shown) edges of a substrate S may be urged against the at least one registration member 20f arranged in the registering state to register the substrate S on the support surface 615 in the preselected position 22a (shown in FIG. 2).

In a next step S210, the substrate S is processed according to appropriate processes, such as printing an image on an outer surface of the substrate S, fixing the image to the substrate S and/or cutting the substrate S.

Figure 9A:
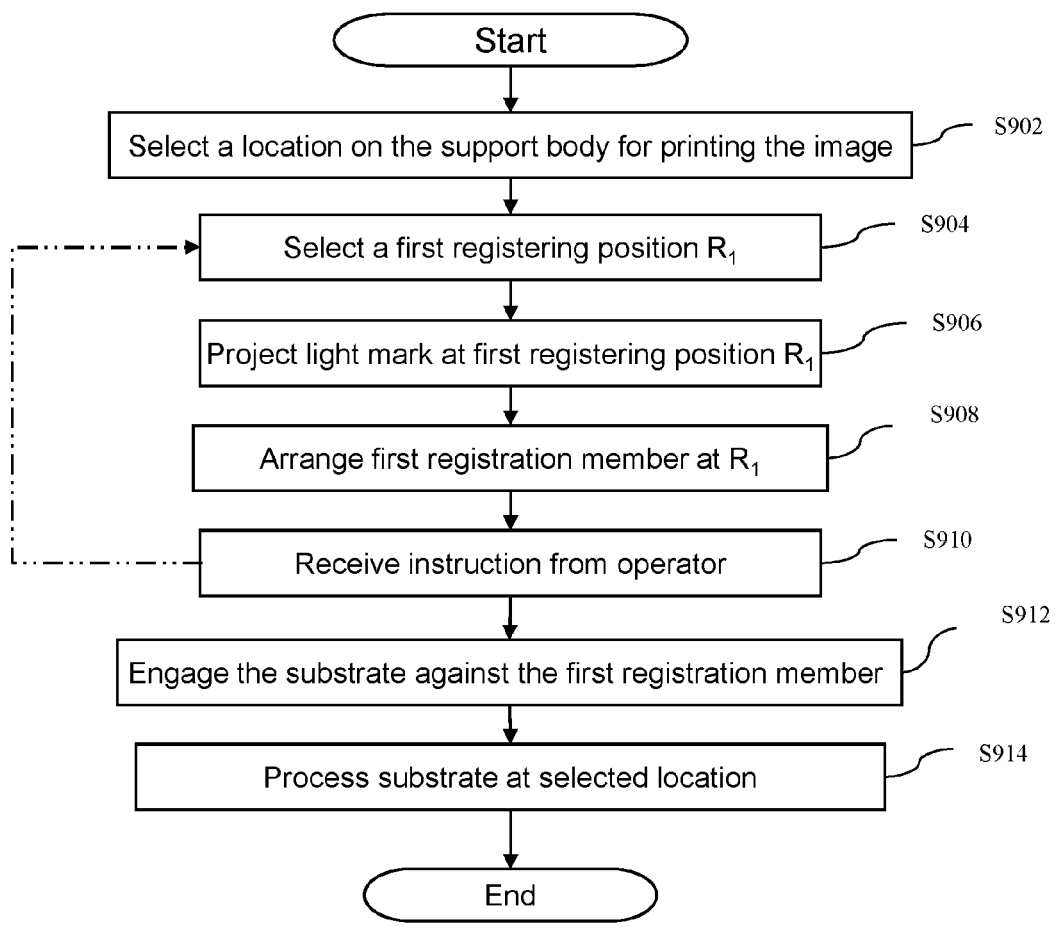
FIGS. 9A-9B show a workflow of a modified embodiment of the method according to the FIG. 2B and detailed view of a modified embodiment of the apparatus of FIG. 2A, respectively.
Figure 9B:
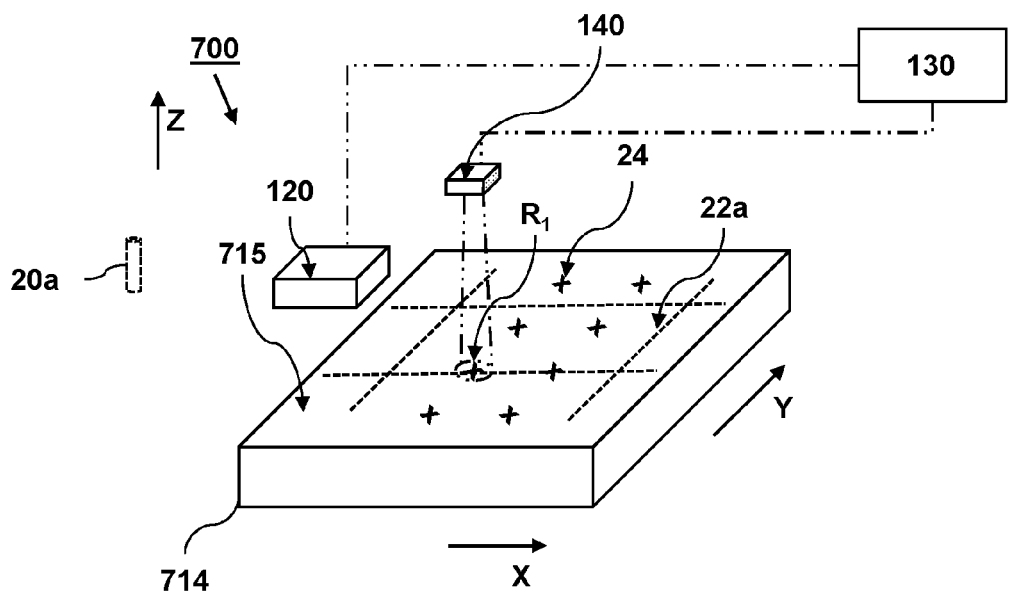

FIGS. 9A-9B show a workflow of a modified embodiment of the method according to the FIG. 2B and a detailed view of a modified embodiment of the apparatus of FIG. 2A, respectively. FIG. 9B shows a detailed perspective view on a support body 714 of the apparatus 700. The apparatus 700 comprises the support body 714, at least one registration member 20a, a carriage unit 120, a light projecting device 140 and a control unit 130.

Each of the at least one registration member 20a is arranged for detachably coupling to the support body 714. The support body 714 comprises a support surface 715 extending in a direction X and a direction Y normal to the direction X. The light projecting device 140 is arranged facing the support surface 715 for projecting a light mark on the support surface 715 of the support body 714. The control unit 130 is connected to the light projecting device 140 for controlling the light projecting device 140.

Now referring to the flowchart shown in FIG. 9A, in a first step S902 of the method a position 22*a* for the substrate S is selected by the control unit 130 on the support surface 715 of the support body 714. The position of the substrate 22*a* may be selected based on a shape and/or size of the substrate S.

In a next step S904, the control unit 130 selects a first registering position $R_1$ on the support body 914 of a first registration member 20*a* for registering the substrate S at the selected position 22*a* in the registering state of the first registration member 20*a*. The first registering position $R_1$ is selected from a plurality of possible registering positions 24, which are distributed over the support surface 715 of the support body 114. The registering positions 24 are arranged in a matrix extending both in directions X and Y. For example, the registering positions 24 may be arranged in rows extending in the direction Y, as shown in FIG. 9B, the rows being arranged adjacent one another in the direction X. Each of the registering positions comprises a receiving hole for receiving a registration member 20*a*, such as a registration pin, and retaining the registration member 20*a* in the registering state.

In step S906 the control unit 130 controls the light projecting device 140 to project a light mark on the support surface 715 at the first registering position $R_1$ of the support body 714. The light mark may, for example, be a cross beam or have any other suitable shape for indicating the first registering position $R_1$. In this way, the location of the first registering position $R_1$ on the support body 715 is clearly visible to an operator.

In step S908 the operator manually attaches the first registration member 20*a* to the support body 714 at the first registering position $R_1$ on the support surface 715. For example, the operator may attach the first registration member 20*a* to the receiving hole by screwing the first registration member 20*a* into a female screw shaped receiving hole. In another example, the registration pin 20*a* is attached to the support body by partially accommodating the registration pin 20*a* into the receiving hole, wherein the receiving hole is shaped to be conformal to the circumference of the registration pin 20*a*.

In step S910 the operator provides an instruction to the control unit 130, e.g. by way of a user inter face coupled to the control unit 130, that the first registration member 20*a* is arranged at the first registering position $R_1$ in the registering state.

When the control unit 130 receives the instruction of the operator, the steps S904-S910 may be repeated to arrange a second registration member 20*b* on a second registering position $R_2$ on the support surface 315 to register the substrate S in the substrate position 22*a*, selected in step S902.

After sufficient registration members 20*a* have been arranged by the operator in selected positions on the support surface 715 to register the substrate S, in step S912 edges of a substrate S may be urged against the at least one registration member 20*a* arranged in the registering state to register the substrate S on the support surface 715 in the preselected position 22*a* (shown in FIG. 9B).

In a next step S914 the control unit 130 controls the carriage unit 120 to process the substrate S at the position 22*a*. The substrate S is processed according to appropriate processes, such as printing an image on an outer surface of the substrate S, fixing the image to the substrate S and/or cutting the substrate S.

In a modified example of the method according to FIG. 9A, in step S904 the control unit 130 further selects an orientation of the first registration member 20*a* at the first registering position $R_1$ on the support surface 715. For example, if the first registration member 20*a* is a registration ruler having an alignment edge extending in a first direction, the control unit 130 selects the orientation of the alignment edge in the registered state of the registration ruler, such that the alignment edge is arranged parallel to an edge of the substrate, when the substrate is positioned in the selected position 22*a*.

For example, in step S902 the control unit first selects a skew orientation of the substrate relative to the support surface 715 at the desired position on the support body 22*a*. In step S904 the orientation of the alignment edge of the registration ruler is based on the selected skew orientation of the substrate in the preselected position 22*a*.

In the light projecting step S906, the light mark projected on the support surface 715 indicates the desired orientation of the alignment edge of the registration ruler at the first registering position $R_1$. For example, the light mark comprises an arrow indicating the desired orientation of the aligning edge.

The operator is visually instructed at which orientation relative to the support surface 715 to attach the registration ruler at the first registering position $R_1$. In this way, registering of the substrate S in a desired skew orientation relative to the support surface 715 is supported.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any advantageous combination of such claims are herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An apparatus for processing a substrate on a support body, the apparatus comprising the support body, at least one registration member, a carriage unit and a control unit; the support body being arranged for supporting the substrate; the at least one registration member being adapted for registering the substrate on the support body by engaging the substrate in contact to the at least one registration member, when the at least one registration member is arranged into a registering state; the carriage unit being movably arranged relative to the support body for processing the substrate; wherein the control unit is arranged for executing the steps of:
   a) selecting a position of the substrate on the support body;
   b) selecting a first registering position on the support body of a first registration member for registering the substrate at the selected position on the support body in the registering state, when engaging the substrate in contact with the first registration member being arranged in the first registering position; and
   c) moving the carriage unit relative to the support body to a processing position for processing the substrate, when the substrate is registered at the selected position on the support body by engaging the substrate in contact with the first registration member, which is arranged in the registering state in the first registering position.

2. The apparatus according to claim 1, wherein the control unit is further arranged for:
   d) selecting a second registering position on the support body of a second registration member, the second registering position being selected for registering the substrate on the selected position on the support body in the registering state in cooperation with the first registration member, when engaging the substrate in contact with the first registration member and second registration member at the same time.

3. The apparatus according to claim 2, wherein the first registering position and the second registering position of the first and second registration member, respectively, are selected based on a shape of the substrate.

4. The apparatus according to claim 2, wherein the control unit is further arranged for:
   e) selecting a skew orientation of the substrate on the support body in the selected position; and
   Wherein the first registering position and the second registering position of the first registration member and second registration member, respectively, are selected based on the selected skew orientation.

5. The apparatus according to claim 1, wherein the apparatus further comprises a registration actuator mechanism for positioning each registration member on the support body in the registering state, and wherein the control unit is further arranged for:
   f) controlling the registration actuator mechanism to arrange the first registration member in the registering state at the selected first registering position on the support body.

6. The apparatus according to claim 5, wherein the registration actuator mechanism is movably arranging relative to the support body, and wherein step f) comprises further the step of moving the registration actuator mechanism relative to the support body towards the first registering position for arranging the first registration member at the selected first registering position in the registering state.

7. The apparatus according to claim 5, wherein the registration actuator mechanism comprises a plurality of registration units distributed inside the support body, each registration unit comprising a registration member and an actuator for arranging the registration member into the registering state, the actuator being controllable by the control unit; wherein in step b) the control unit selects the first registering position based on the locations of the plurality of registration units in the support body; and in step f) the control unit controls the actuator of the registration unit at the selected first registering position to arrange its registration member, being the first registration member, into the registering state at the selected first registering position.

8. The apparatus according to claim 1, wherein the control unit is further arranged for:
   g) indicating to an operator the first registering position on the support body for arranging the first registration member.

9. The apparatus according to claim 8, wherein step g) comprises projecting a light mark on the support body at the first registering position.

10. The apparatus according to claim 8, wherein the control unit further comprises a user interface for receiving instructions from an operator, and the control unit is further arranged for:
   h) waiting for an instruction from the operator that the first registration member is arranged in the registering state at the first registering position on the support body; and
   i) in response to said instruction, indicating to an operator a second registering position on the support body for arranging a second registration member in the registering state for registering the substrate at the selected position.

11. The apparatus according to claim 1, wherein the at least one registration member is connectable to the support body, each registration member comprising a positioning element for connecting the first registration member to the support body in the registering state; and an aligning edge for contacting the substrate and wherein in step b) the first registering position is selected further based on a predetermined distance between the positioning element and the aligning edge to register the substrate at the selected position.

12. The apparatus according to claim 11, wherein the control unit is arranged for:
   j) selecting the first registration member from a set of registration members having differing distances between the positioning element and the aligning edge based on a distance between the position of the substrate selected in step a) and the first registering position selected in step b).

13. The apparatus according to claim 11, wherein the control unit is arranged for:
   k) selecting the first registration member from a set of registration members having an aligning edge of differing shapes based on a shape of the substrate.

14. The apparatus according to claim 1, wherein the support body comprises a plurality of receiving elements distributed on positions over the support body for retaining a registration member in the registering state at the respective positions, and wherein in step b) the first registering position is selected from one of the positions of said plurality of receiving elements.

15. The apparatus according to claim 1, wherein the apparatus is a printing apparatus, wherein the printing apparatus further comprises a print head assembly arranged for providing an image on the substrate, when the substrate is registered in the selected position, wherein the print head assembly is mounted to the carriage unit.

16. A method for processing a substrate on a support body of a printing apparatus, the printing apparatus comprising the support body, a registration member, a carriage unit, and a control unit, wherein:
   the support body is arranged for supporting the substrate and is provided with a plurality of spaced apart registering positions;

the registration member is adapted for registering the substrate on the support body by engaging the substrate in contact to the registration member, when the registration member is arranged into a registering state;

the carriage unit is movably arranged relative to the support body for processing the substrate, wherein the method comprises the steps of:
  a. the control unit selecting a substrate position for the substrate on the support body;
  b. the control unit selecting a first registering position from the plurality of registering positions on the support body for the registration member;
  c. moving the registration member with respect to the support body for positioning the registration member into a registering state at the selected first registering position, such that the registration member is arranged for engaging the substrate; and
  d. the control unit moving the carriage unit relative to the support body to a processing position for processing the substrate, when the substrate is registered at the selected substrate position on the support body by engaging the substrate in contact with the registration member, which is arranged in the registering state in the first registering position.

* * * * *